United States Patent
Ben-Natan

(10) Patent No.: US 9,754,812 B2
(45) Date of Patent: Sep. 5, 2017

(54) ADAPTABLE END EFFECTOR

(71) Applicant: CAMTEK LTD., Migdal-Haemek (IL)

(72) Inventor: Arnon Ben-Natan, Kiryat Tiv'on (IL)

(73) Assignee: CAMTEK LTD., Migdal Haemeq (IL)

( * ) Notice: Subject to any disclaimer, the term of this patent is extended or adjusted under 35 U.S.C. 154(b) by 0 days.

(21) Appl. No.: 15/046,527

(22) Filed: Feb. 18, 2016

(65) Prior Publication Data

US 2016/0247706 A1    Aug. 25, 2016

Related U.S. Application Data

(60) Provisional application No. 62/119,190, filed on Feb. 22, 2015.

(51) Int. Cl.
| | | |
|---|---|---|
| *B66C 1/02* | (2006.01) | |
| *B25B 11/00* | (2006.01) | |
| *H01L 21/683* | (2006.01) | |
| *B25J 15/06* | (2006.01) | |
| *B25J 11/00* | (2006.01) | |
| *H01L 21/687* | (2006.01) | |

(52) U.S. Cl.
CPC ....... *H01L 21/6838* (2013.01); *B25J 11/0095* (2013.01); *B25J 15/0616* (2013.01); *H01L 21/68707* (2013.01)

(58) Field of Classification Search
CPC .................................. H01L 21/6838
USPC ............... 294/185–188, 213, 907; 269/21; 414/627, 737, 941
See application file for complete search history.

(56) References Cited

U.S. PATENT DOCUMENTS

| | | | | |
|---|---|---|---|---|
| 4,620,738 A * | 11/1986 | Schwartz | ............... | B65G 47/91 271/90 |
| 4,721,462 A * | 1/1988 | Collins, Jr. | ............ | B25B 11/005 248/362 |
| 5,226,636 A * | 7/1993 | Nenadic | ................ | B25B 11/005 269/21 |
| 5,564,682 A * | 10/1996 | Tsuji | ..................... | B25B 11/005 269/21 |
| 5,967,159 A * | 10/1999 | Tateyama | ............ | H01L 21/6838 134/61 |
| 6,062,241 A * | 5/2000 | Tateyama | .............. | B25B 11/007 134/133 |
| 6,068,316 A * | 5/2000 | Kim | .................... | H01L 21/6838 294/186 |
| 6,077,026 A * | 6/2000 | Shultz | ............... | H01L 21/67778 294/188 |
| 6,182,957 B1 * | 2/2001 | Becker | .................. | B25B 11/005 269/11 |
| 6,193,807 B1 * | 2/2001 | Tateyama | ............. | B25B 11/007 134/133 |
| 6,254,155 B1 * | 7/2001 | Kassir | ................ | H01L 21/6838 294/185 |

(Continued)

*Primary Examiner* — Paul T Chin
(74) *Attorney, Agent, or Firm* — Reches Patents

(57) ABSTRACT

An adaptable end effector may include a substrate interface may be configured to support a substrate. The substrate interface may include multiple groups of vacuum openings that are associated with a plurality of types of substrates. A vacuum system may be configured to supply vacuum only to one or more selected groups of vacuum openings that are associated with a given type of substrates when the adaptable end effector supports a substrate of the given type of substrates.

23 Claims, 11 Drawing Sheets

(56) References Cited

U.S. PATENT DOCUMENTS

| | | | |
|---|---|---|---|
| 7,044,521 B2* | 5/2006 | Tokunaga | H01L 21/6838 294/183 |
| 2013/0115030 A1* | 5/2013 | Nisany | B65G 47/905 414/225.01 |

* cited by examiner

Selecting or receiving a selection of a given type of substrate that is either supported by an adaptable end effector or is scheduled to be supported by the adaptable end effector. The adaptable end effector and even the entire robot may receive a command or information about the given type of substrate that should be supported. Alternatively, the adaptable end effector may sense the type of substrate that is positioned on the adaptable end effector. 610

Supplying vacuum only to one or more selected groups of vacuum openings that are associated with the given type of substrates; and wherein the one or more selected group of vacuum openings belong to multiple groups of vacuum openings that are associated with a plurality of types of substrates. 620

ADAPTABLE END EFFECTOR

RELATED APPLICATIONS

This application claims priority from U.S. provisional patent application 62/119,190 filing date Feb. 22, 2015, which is being incorporated herein by reference.

BACKGROUND OF THE INVENTION

Substrates are usually stored in cassettes. The cassettes are loaded to inspection or metrology systems via load ports. The system that may be used for inspection of substrates usually includes a substrate loader. The substrate loader usually has a pre-aligner and a robotic arm that unloads substrates from the cassette and loads (returns) substrates to the cassette. The robotic arm has an end effector that has to contact the substrate.

There are substrates of different types and sizes and till now each substrate needed a different end effector.

BRIEF DESCRIPTION OF THE INVENTION

The present invention will be understood and appreciated more fully from the following detailed description taken in conjunction with the drawings in which:

FIG. 11 illustrates a method according to an embodiment of the invention.

DETAILED DESCRIPTION OF THE INVENTION

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

There is provided an adaptable end effector. The end effector has multiple vacuum outputs. Different types of substrates require the different vacuum outputs are required to provide vacuum while other vacuum outputs are prevented from providing vacuum. For example—the output vacuums may be arranged in two groups—a first group of output vacuums is active when supporting one type of substrate and inactive when supporting a second type of substrate while a second group of output vacuums is inactive when supporting one type of substrate and active when supporting a second type of substrate while a second group.

For example—when supporting a bare wafer the end effector should apply vacuum at the center of the end effector—which may be near the center of the bare wafer. Applying vacuum at the end of an end effector when the end effector supports a diced wafer may damage the diced wafer.

Figure 1:
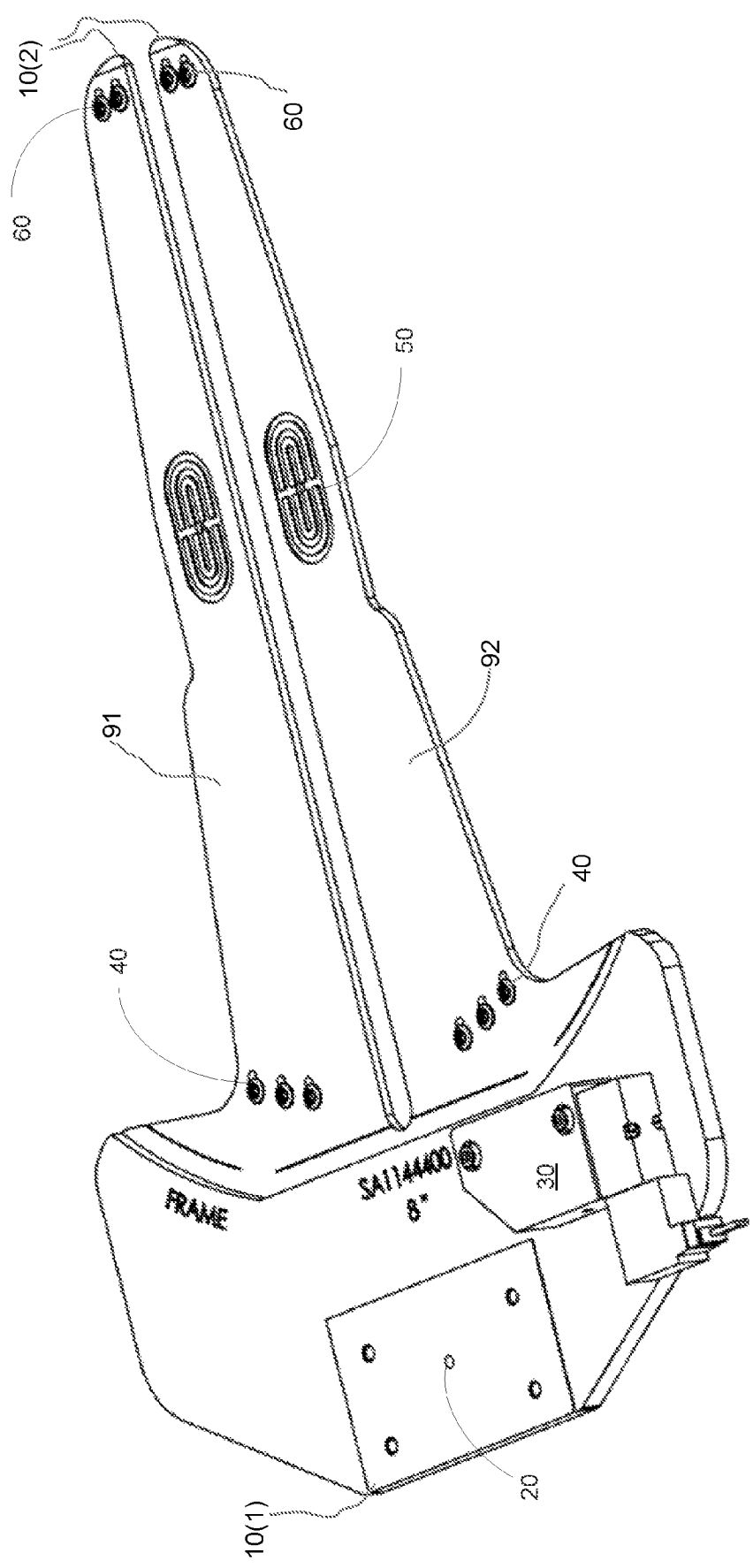
FIGS. 1 and 2 illustrate an adaptable end effector according to an embodiment of the invention.
Figure 2:
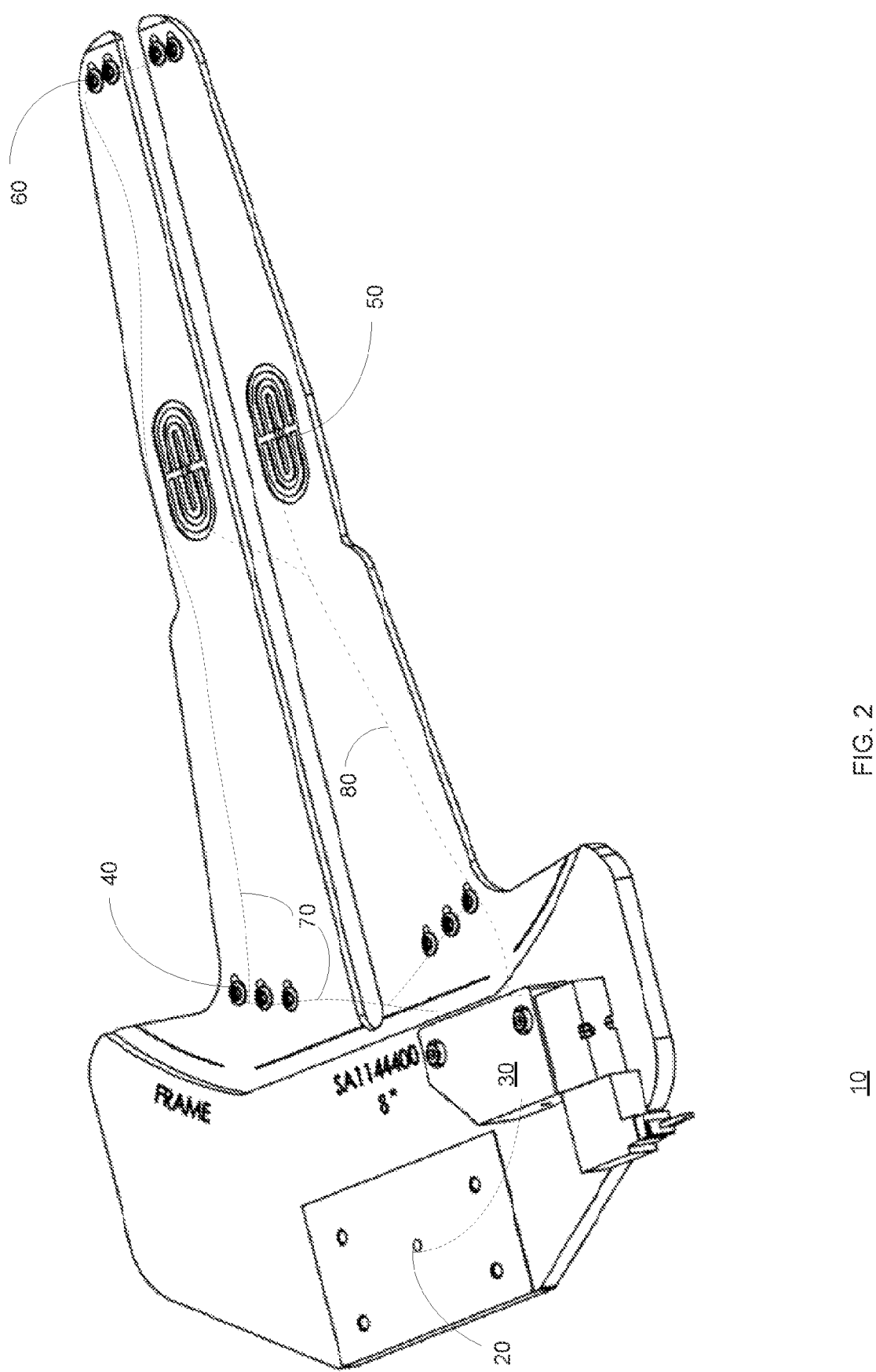

FIGS. 1 and 2 illustrate an adaptable end effector 10 according to an embodiment of the invention.

The adaptable end effector 10 may support two types of wafers—diced wafer and non-diced wafers such as bare wafers.

The adaptable end effector 10 has a substrate interface that includes a pair of arms 91 and 92 that support substrates. The end effector has central vacuum openings 50 and peripheral vacuum openings 40 and 60.

The adaptable end effector 10 includes two groups of vacuum outputs.

A first group of vacuum outputs includes two first subgroups of vacuum outputs—proximal peripheral vacuum openings 40 that are located close (a fraction of the length of the adaptable end effector) to proximal end 10(1) of the adaptable end effector 10 and distal peripheral vacuum openings 60 that are located close a fraction of the length of the adaptable end effector) to the proximal end 19(2) of the adaptable end effector 10. The fraction of the length of the adaptable end effector can range between 1% and 35%.

The end effector is connected another part of the robot (such as an arm of the robot) near the proximal end of the end effector.

A second group of vacuum outputs includes central vacuum openings 50.

The peripheral vacuum openings 40 and 60 are associated with diced wafer—as they support the frame of the dice wafer. The frame supports a tape that in turn supports the diced dies.

In FIG. 1 the distal peripheral vacuum openings 60 are illustrated as including two sub-groups (one per arm 91 and 92) of three vacuum openings.

The proximal peripheral vacuum openings 40 are illustrated as including two sub-groups (one per arm 91 and 92) of two vacuum outputs.

The adaptable end effector has a vacuum system that may provide vacuum to the central vacuum openings 50 or to the peripheral vacuum openings 40 and 60—depending upon the type of substrate supported by the end effector. The adaptable end effector 10 may receive a control signal (for example from a controller of a system) that determines the selection.

Referring to FIGS. 1 and 2—the end effector 10 has a vacuum input 20 and a switch 30. The switch may select whether to provide vacuum to vacuum conduits 70—thereby supplying vacuum to peripheral vacuum openings 40 and 60—or to provide the vacuum to vacuum conduits 80—thereby supplying vacuum to central vacuum openings 50.

The vacuum conduits 70 and 80 may be formed within arms 91 and 92 but may extend outside these arms.

While the peripheral vacuum openings 40 and 60 are shaped as nipples the central vacuum openings 50 are formed within multiple trenches that are spaced apart from each other to form a so-called fingerprint pattern. The fingerprint pattern provides vacuum through the trenches while elevated inter-trench areas provide structural support.

Figure 3:
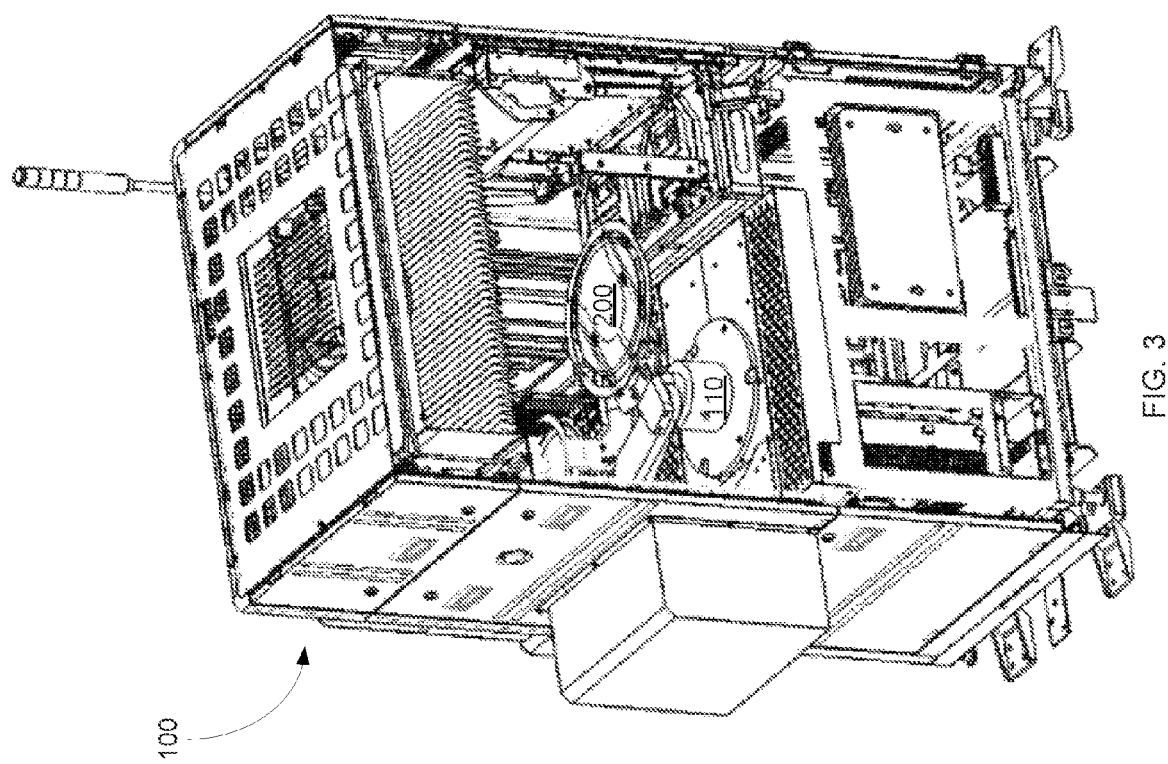
FIGS. 3 and 4 illustrates a system, a robot that includes an adaptable end effector that supports a diced wafer according to an embodiment of the invention.
Figure 4:
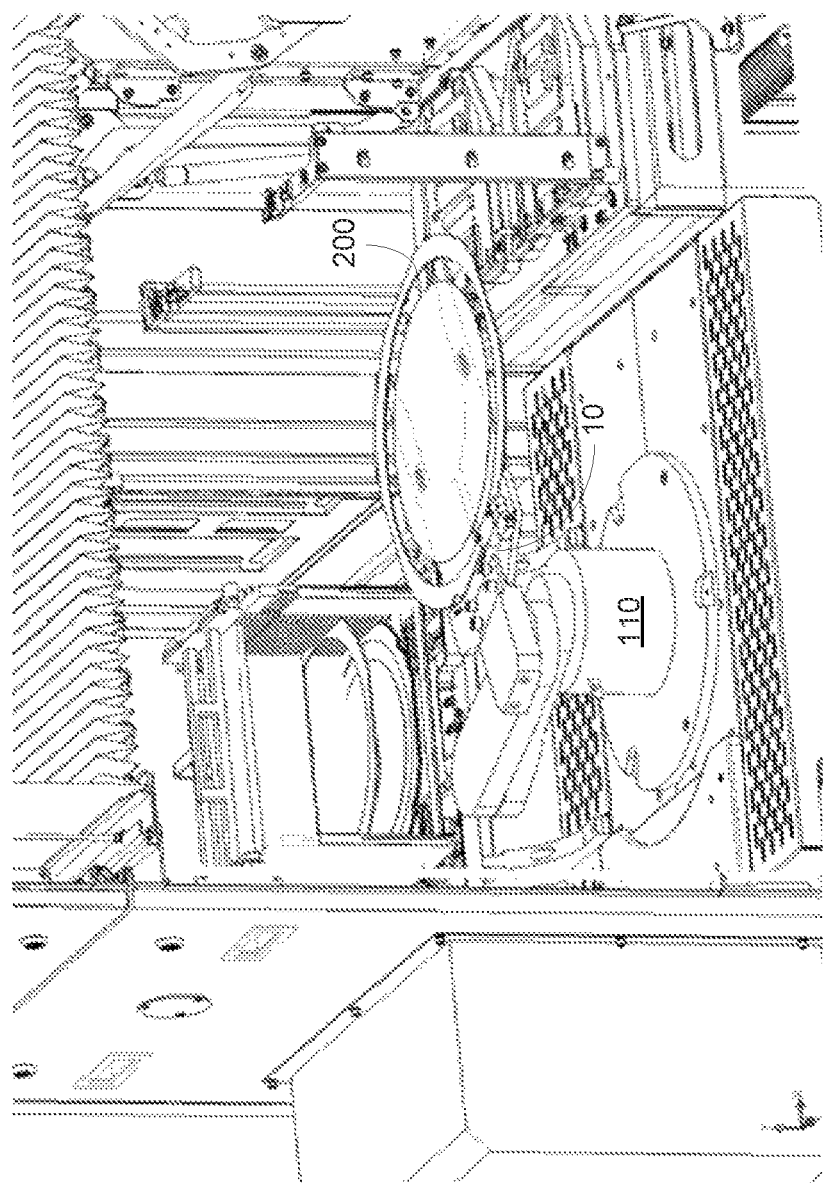

FIGS. 3 and 4 illustrates a system 100, a robot 110 that includes an adaptable end effector 10 that supports a diced wafer 200—at the frame of the diced wafer, according to an embodiment of the invention.

Figure 5:
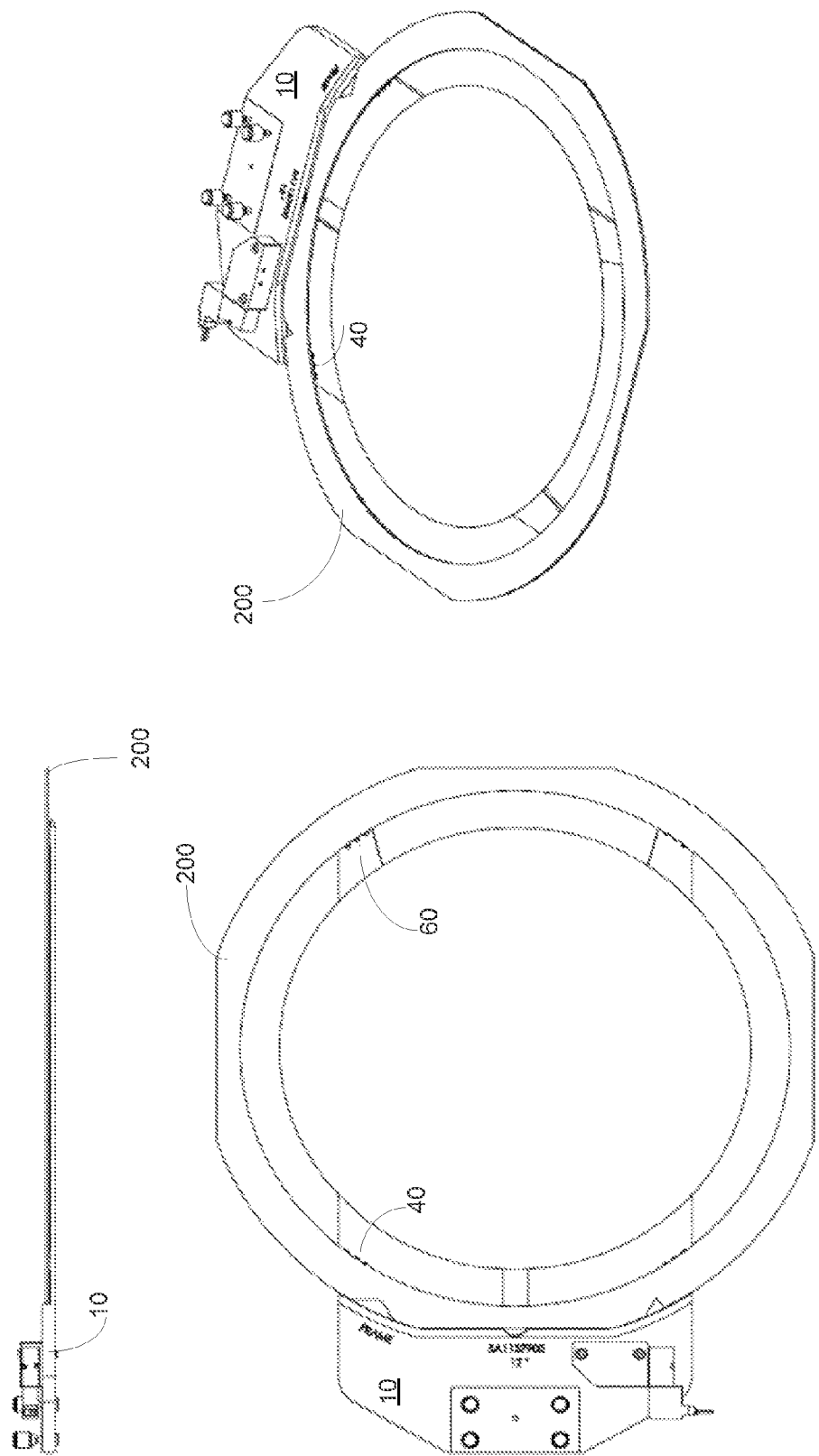
FIG. 5 illustrates an adaptable end effector that supports a diced wafer according to an embodiment of the invention.

FIG. 5 illustrates an adaptable end effector 10 that supports a diced wafer 200 according to an embodiment of the invention.

Figure 6:
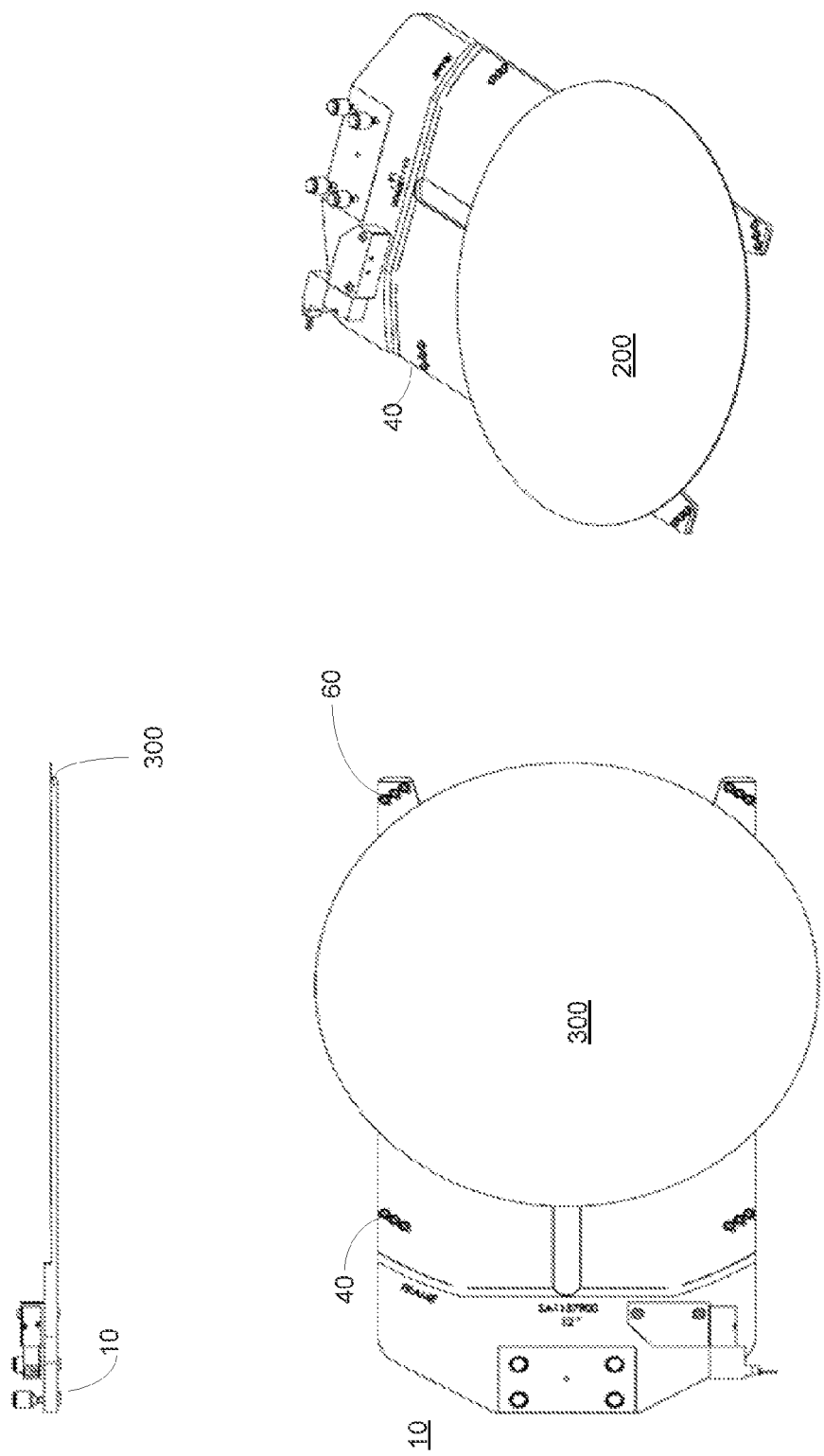
FIG. 6 illustrates an adaptable end effector that supports a bare wafer according to an embodiment of the invention.

FIG. 6 illustrates an adaptable end effector 10 that supports a bare wafer 300 according to an embodiment of the invention.

In FIG. 6 the bare wafer receives vacuum through the central vacuum openings 50 (not shown) that are located beneath the center of the bare wafer 300. In FIG. 6 the peripheral vacuum openings 40 and 60 are positioned outside the bare wafer 300—and are not contacted by bare wafer 300.

Figure 7:
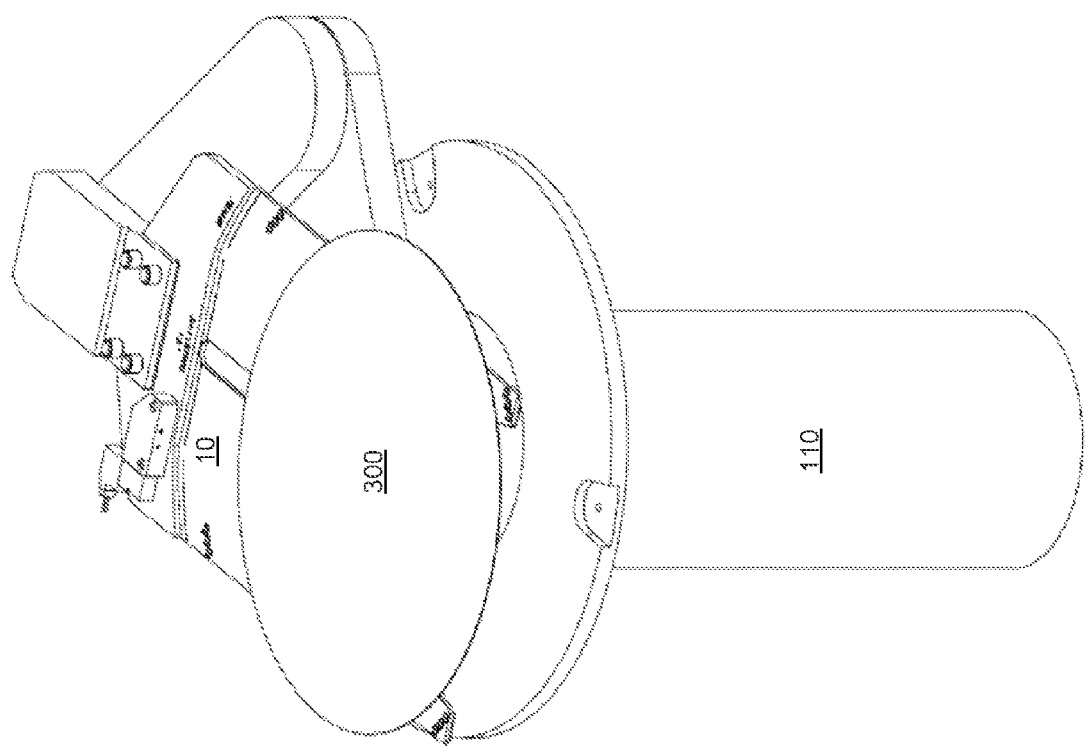
FIG. 7 illustrates a robot that includes an adaptable end effector that supports a bare wafer according to an embodiment of the invention.

FIG. 7 illustrate a robot 110 that includes an adaptable end effector 10 that supports a bare wafer 300 according to an embodiment of the invention.

Figure 8:
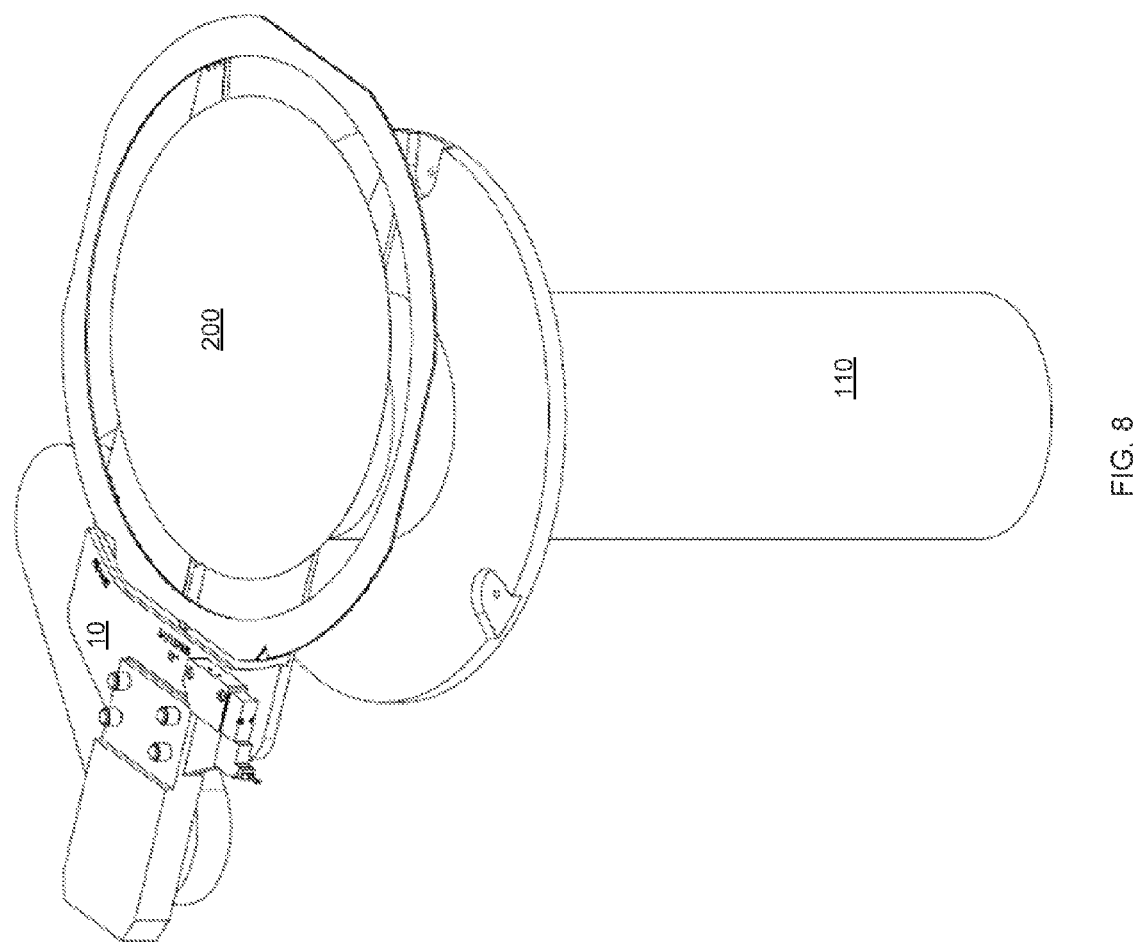
FIG. 8 illustrates a robot that includes an adaptable end effector that supports a diced wafer according to an embodiment of the invention.

FIG. 8 illustrates a robot 110 that includes an adaptable end effector 10 that supports a diced wafer 200 according to an embodiment of the invention.

Figure 9:
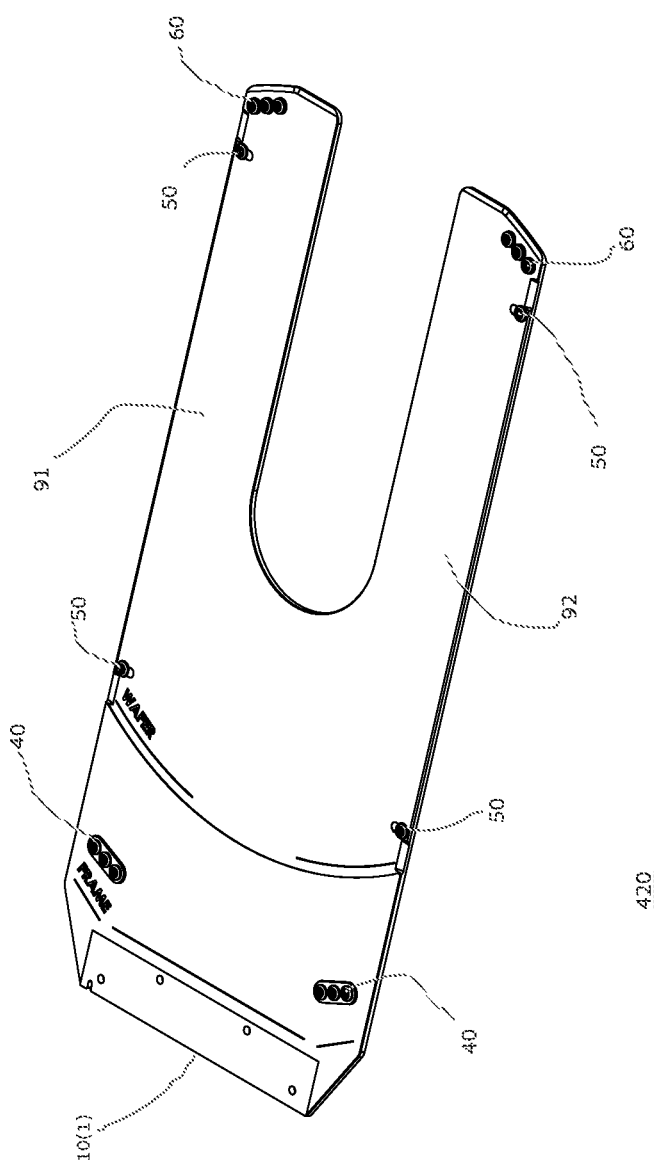
FIG. 9 illustrates an adaptable end effector that supports non-diced and a diced wafers according to an embodiment of the invention.

FIG. 9 illustrates an adaptable end effector 420 according to an embodiment of the invention.

Adaptable end effector 420 includes (a) a substrate interface that includes a pair of arms 91 and 92 that support substrates, (b) an inner group of vacuum openings 50', (c) peripheral vacuum openings 40 and 60, (d) vacuum system and vacuum conduits (not shown) that may resemble the vacuum system and vacuum conduits of the adaptable end effector of FIG. 2.

One of the main differences between adaptable end effector 10 of FIGS. 1 and 2 and adaptable end effector 420 of FIG. 9 is that the inner group of vacuum openings 50' of adaptable end effector 420 includes multiple (four) spaced apart sub-groups of vacuum openings that are spaced apart from each other—instead of a concentrated group of central vacuum openings 50.

Figure 10:
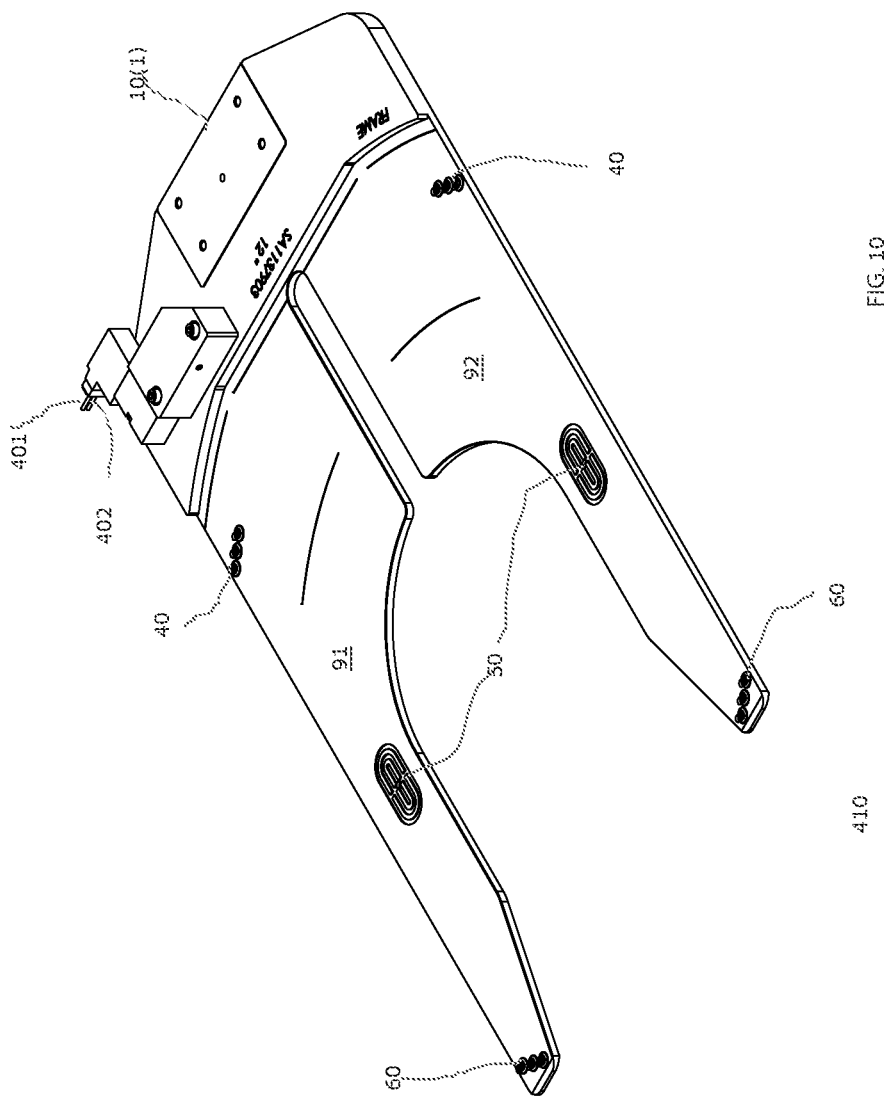
FIG. 10 illustrates an adaptable end effector that supports non-diced and a diced wafers according to an embodiment of the invention.

FIG. 10 illustrates an adaptable end effector 410 according to an embodiment of the invention.

One of the main differences between adaptable end effector 10 of FIGS. 1 and 2 and adaptable end effector 410 of FIG. 10 is that adaptable end effector 410 has two vacuum inputs 401 and 402 and the type of substrate supported by the adaptable end effector 410 determined which vacuum input provides vacuum. Thus, instead of selecting the vacuum path by the adaptable end effector 10 (for example by switch)—the selection is made by the vacuum source that supplied vacuum only to one vacuum input.

It is noted that the mentioned above figures provide only non-limiting of end effectors. The number, location, shape, size of the groups of vacuum openings as well as the number of vacuum openings per group may vary from those illustrated in FIGS. 1-10. The shape and size of the substrate interface (two parallel arms) may differ from those illustrated in FIGS. 1-10. The distribution of the vacuum between the vacuum openings can be done by other vacuum arrangements—for example there may be more than a single vacuum switch, the vacuum paths may share one or more conduits, and the like.

FIG. 11 illustrates method 600 according to an embodiment of the invention.

Method 600 may include the following steps:
a. Step 610 of selecting or receiving a selection of a given type of substrate that is either supported by an adaptable end effector or is scheduled to be supported by the adaptable end effector. The adaptable end effector and even the entire robot may receive a command or information about the given type of substrate that should be supported. Alternatively, the adaptable end effector may sense the type of substrate that is positioned on the adaptable end effector.
b. Step 620 of supplying vacuum only to one or more selected groups of vacuum openings that are associated with the given type of substrates; and wherein the one or more selected group of vacuum openings belong to multiple groups of vacuum openings that are associated with a plurality of types of substrates.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations, and alternatives are also possible. The specifications and drawings are, accordingly, to be regarded in an illustrative rather than in a restrictive sense.

The word "comprising" does not exclude the presence of other elements or steps then those listed in a claim. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe.

Thus, these terms are not necessarily intended to indicate temporal or other prioritization of such elements. The mere fact that certain measures are recited in mutually different claims does not indicate that a combination of these measures cannot be used to advantage.

I claim:

1. An adaptable end effector that comprises:
a substrate interface that is configured to support a substrate; wherein the substrate interface comprises multiple groups of vacuum openings that are associated with a plurality of types of substrates; wherein the plurality of types of substrates comprise a diced substrate and a non-diced substrate;
wherein the multiple groups of vacuum opening comprise a first group of vacuum openings that is associated with the diced substrate and a second group of vacuum openings that is associated with the non-diced substrate;
a vacuum system that is configured to supply vacuum only to one or more selected groups of vacuum openings that are associated with a given type of substrates when the adaptable end effector supports a substrate of the given type of substrates;
wherein the first group of vacuum openings comprises two first sub-groups of vacuum openings;
wherein the second group of vacuum openings is positioned between the two first sub-groups of vacuum openings; and
wherein at least one of the following is true:
(i) wherein the second group of vacuum openings are formed within multiple trenches that are spaced apart from each other by elevated inter-trench areas; and
(ii) the adaptable end effector comprises a pair of arms; wherein the two first sub-groups of vacuum openings comprise (a) proximal peripheral vacuum openings that are located in proximity to a proximal end of the adaptable end effector; and (b) distal peripheral vacuum openings that are located in proximity to a distal end of each of the pair of arms.

2. The adaptable end effector according to claim 1 wherein the first group of vacuum openings is positioned at a location that corresponds to a location of a frame of the diced substrate when the diced substrate is supported by the substrate interface.

3. The adaptable end effector according to claim 1 wherein the second group of vacuum openings is positioned at a location that corresponds to a location of a center of the non-diced substrate when the non-diced substrate is supported by the substrate interface.

4. The adaptable end effector according to claim 1 wherein the vacuum openings of the first group of vacuum openings surround the vacuum openings of the second group of vacuum openings.

5. The adaptable end effector according to claim 1 wherein the vacuum openings of the first group of vacuum openings differ by shape from the vacuum openings of the second group of vacuum openings.

6. The adaptable end effector according to claim 1 wherein the vacuum openings of the first group of vacuum openings are positioned within a virtual ring shaped area of the substrate interface.

7. The adaptable end effector according to claim 1 wherein the vacuum system is configured to supply vacuum only to one or more first selected groups of vacuum openings that are associated with a first type of substrates when the adaptable end effector supports a substrate of the first type of substrates; and wherein the vacuum system is configured to supply vacuum only to one or more second selected groups of vacuum openings that are associated with a second type of substrates when the adaptable end effector supports a substrate of the second type of substrates.

8. The adaptable end effector according to claim 1 comprising multiple opening conduits that are formed within the substrate interface and are configured to supply vacuum to the multiple groups of vacuum openings.

9. The adaptable end effector according to claim 1 wherein the vacuum system comprises: (a) an input vacuum conduit for receiving vacuum, (b) multiple opening vacuum conduits for supplying vacuum to the multiple groups of vacuum openings, and (c) at least one switch for providing the vacuum only to one or more selected opening conduits that provide vacuum only to the one or more selected groups of vacuum openings when the adaptable end effector supports the substrate of the given type of substrates.

10. The adaptable end effector according to claim 1 wherein the vacuum system comprises multiple input vacuum conduits that are associated with the plurality of types of substrates, wherein only a selected input vacuum conduit that is associated with a given type of substrates provides vacuum when the adaptable end effector supports a substrate of the given type of substrates.

11. The adaptable end effector according to claim 1 comprising sensors for sensing a type of substrate that is supported by the adaptable end effector.

12. The adaptable end effector according to claim 1 comprising the pair of arms; wherein the two first sub-groups of vacuum openings comprise (a) proximal peripheral vacuum openings that are located in proximity to the proximal end of the adaptable end effector; and (b) distal peripheral vacuum openings that are located in proximity to the distal end of each of the pair of arms.

13. The adaptable end effector according to claim 1 wherein the two first sub-groups of vacuum openings differ from each other by a number of vacuum openings.

14. The adaptable end effector according to claim 1 wherein the second group of vacuum openings are formed within multiple trenches that are spaced apart from each other by elevated inter-trench areas.

15. The adaptable end effector according to claim 1 wherein the second group of the vacuum openings is positioned at a center of each arm of the pair of arms.

16. The adaptable end effector according to claim 1 wherein distances between vacuum openings of the second group and a proximal end of the adaptable end effector differ than distances between the proximal end of the adaptable end effector and vacuum openings of the first group.

17. The adaptable end effector according to claim 1 wherein some of the vacuum openings of the first group of vacuum openings are closer to the proximal end of the adaptable end effector than the second group of vacuum openings.

18. The adaptable end effector according to claim 1 wherein some of the vacuum openings of the first group of vacuum openings are more distance from the proximal end of the adaptable end effector than the second group of vacuum openings.

19. A method for supporting a substrate, the method comprises: selecting or receiving a selection of a given type of substrate that is either supported by an adaptable end effector or is scheduled to be supported by the adaptable end effector; and supplying vacuum only to one or more selected groups of vacuum openings that are associated with the given type of substrates; wherein the one or more selected group of vacuum openings belong to multiple groups of vacuum openings that are associated with a plurality of types of substrates; wherein the plurality of types of substrates comprise a diced substrate and a non-diced substrate;
   wherein the multiple groups of vacuum openings comprise a first group of vacuum openings that is associated with a diced substrate and a second group of vacuum openings that is associated with a non-diced substrate;
   wherein at least one of the following is true:
      (i) the second group of vacuum openings are formed within multiple trenches that are spaced apart from each other by elevated inter-trench areas; and
      (ii) the adaptable end effector comprises a pair of arms; wherein the two first sub-groups of vacuum openings comprise (a) proximal peripheral vacuum openings that are located in proximity to a proximal end of the adaptable end effector; and (b) distal peripheral vacuum openings that are located in proximity to a distal end of each of the pair of arms.

20. The method according to claim 19, wherein the two first sub-groups of vacuum openings differ from each other by the number of vacuum openings.

21. The method according to claim 19, wherein the adaptable end effector comprises the pair of arms; wherein the two first sub-groups of vacuum openings comprise (a) proximal peripheral vacuum openings that are located in proximity to the proximal end of the adaptable end effector; and (b) distal peripheral vacuum openings that are located in proximity to the distal end of each of the pair of arms.

22. The method according to claim 19 wherein the adaptable end effector comprises the pair of arms; wherein the two first sub-groups of vacuum openings comprise (a) proximal peripheral vacuum openings that are located in proximity to the proximal end of the adaptable end effector; and (b) distal peripheral vacuum openings that are located in proximity to the distal end of each of the pair of arms.

23. The method according to claim 19 wherein the second group of vacuum openings are formed within multiple trenches that are spaced apart from each other by elevated inter-trench areas.

* * * * *